United States Patent [19]

Hernandez et al.

[11] Patent Number: 5,034,850
[45] Date of Patent: Jul. 23, 1991

[54] THIN DECOUPLING CAPACITOR FOR MOUNTING UNDER INTEGRATED CIRCUIT PACKAGE

[75] Inventors: Jorge M. Hernandez, Mesa; Andrew B. Feinberg, Tempe, both of Ariz.

[73] Assignee: Rogers Corporation, Rogers, Conn.

[21] Appl. No.: 479,095

[22] Filed: Feb. 12, 1990

[51] Int. Cl.$^5$ .......................... H01G 1/14; H01G 4/10
[52] U.S. Cl. ..................................... 361/306; 361/321
[58] Field of Search ...................... 361/306, 321, 386; 357/74; 174/72, 52 FP; 29/25.42

[56] References Cited

U.S. PATENT DOCUMENTS

| | | | |
|---|---|---|---|
| 2,972,570 | 2/1961 | Haas et al. | 361/321 X |
| 4,665,465 | 5/1987 | Tanabe | 361/306 |
| 4,734,819 | 3/1988 | Hernandez et al. | 361/306 |
| 4,868,711 | 9/1989 | Hirama et al. | 361/321 |

Primary Examiner—Donald A. Griffin
Attorney, Agent, or Firm—Fishman, Dionne & Cantor

[57] ABSTRACT

A rugged, highly reliable, leadless decoupling capacitor is provided which may be positioned between a circuit board and an integrated circuit package including, for example, a leaded surface mounted IC package or Pin Grid Array package. This decoupling capacitor is comprised of a rugged ceramic or like substrate having printed or otherwise applied thereon a very thin high capacitance layer made by thick or thin film processes which is sandwiched between two thin electrode layers. Conductive castellations extend from the electrode layers along the surface of the ceramic substrate for connection to the circuit board. Preferably, an electrically insulative protective layer encapsulates the capacitor. The dielectric layer preferably comprises a high dielectric glass/ceramic dielectric paste or dielectric sol-gel layer. The overall thickness of the decoupling capacitor may be less than 0.020 inch.

24 Claims, 2 Drawing Sheets

THIN DECOUPLING CAPACITOR FOR MOUNTING UNDER INTEGRATED CIRCUIT PACKAGE

BACKGROUND OF THE INVENTION

This invention relates to the field of integrated circuits. More particularly, this invention relates to a method of suppressing noise (e.g. decoupling) from the voltage to ground distribution circuit in integrated circuit packages such as surface mounted leaded or leadless chip carriers, dual-in-line packages, Pin Grid Array and quad flat packages.

This application is related to U.S. Application Serial entitled MOLDED INTEGRATED CIRCUIT PACKAGE INCORPORATING THIN CAPACITOR AND U.S. Application Ser. No. 479,074 entitled INTEGRATED CIRCUIT PACKAGE HAVING AN INTERNAL CAVITY FOR INCORPORATING DECOUPLING CAPACITOR, both of which were invented by Jorge Hernandez and filed contemporaneously with this application.

It is well known in the field of microelectronics that high frequency operation, particularly the switching of integrated circuits, can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these continuing developments make the problem of suppressing noise in the power bus (produced by a large amount of simultaneous gates switching) even more serious than in the past.

Generally, the prevention of the coupling of undesired high frequency noise or interference into the power supply bus for an integrated circuit is accomplished by connecting a decoupling capacitor between the power and the ground leads of the IC. Conventional methods of decoupling (noise suppression) include the use of decoupling capacitors external tot he IC package, such as monolithic multilayer ceramic (MLC) chip capacitors. However, such MLC's suffer from several important drawbacks and problems. For example, each multilayer capacitor occupies printed wiring board "real estate" that could be utilized either by other active components or to make the board smaller. Both alternatives yield a higher density printed circuit board; and it will be appreciated that higher density printed circuit boards currently are one of the primary goals of printed circuit board designers. Still another drawback of ceramic MLC's are their susceptability for cracking and microcracking caused by a wide variety of sources. These cracks are extremely detrimental to the component reliability and usually result in catastrophic failure of the MLC.

In an effort to avoid the problem relating to taking up too much space on the printed circuit board, an external "noise suppression" connection scheme (which has been found to be quite successful), is to mount a decoupling capacitor underneath an integrated circuit. Such decoupling capacitors are commercially available from Rogers Corporation (assignee of the present application) and are sold under the trademark MICRO Q. Examples of these decoupling capacitors are found in U.S. Pat. Nos. 4,475,143, 4,502,101 and 4,748,537, all of which are assigned to the assignee hereof. These patents disclose decoupling capacitors which are particularly well suited for pin grid array and plastic leaded chip carrier packages.

Several of these prior patents disclose decoupling capacitors for use under an integrated circuit package wherein the decoupling capacitor incorporates a ceramic multilayer capacitor chip therein. Unfortunately, it is difficult to proactically utilize these decoupling capacitors in conjunction with many leaded surface mount and other packages due to the small space (e.g. about 0.015 to 0.020 inch) between the circuit board and the package. It is extremely difficult to manufacture a ceramic MLC having a thickness of this small magnitude. In addition, such a thin and small ceramic MLC will not exhibit the mechanical ruggedness required when using automated pick-and-place equipment and will therefore be prone to cracks and failure. While the single layer (as opposed to MLC) decoupling capacitors can easily be made to small thickness, these decoupling capacitors cannot achieve the high capacitance values obtainable by multilayer capacitor chips.

SUMMARY OF THE INVENTION

The above-discussed and other problems and deficiencies of the prior art are overcome or alleviated by the decoupling scheme of the present invention which provides a rugged, highly reliable, leadless decoupling capacitor which may be positioned between a circuit board and integrated circuit package such as, for example, leaded surface mounted or pin grid array IC packages. In accordance with the present invention, a decoupling capacitor is used which is comprised of a rugged ceramic or like substrate having printed or otherwise applied thereon a very thin high capacitance layer made by thick or thin film processes which is sandwiched between two thin electrode layers. Conductive castellations extend from the electrode layers along the surface of the ceramic substrate for connection to the circuit board. Preferably, an electrically insulative protective layer encapsulates the capacitor. The dielectric layer preferably comprises a high dielectric glass-/ceramic dielectric paste or dielectric sol-gel layer. The overall thickness of the decoupling capacitor may be less than 0.020 inch.

The decoupling scheme of the present invention provides many features and advantages relative to prior art decoupling schemes. For example, the very thin dielectric layer (e.g., about 0.001" or less) of the thin film capacitor reduces the inductance of the decoupling capacitor, reduces the inductance of the decoupling loop and enhances the effectiveness of the decoupling capacitor to suppress high frequency noise. Also, the decoupling capacitor will be mechanically rugged and so may be used with existing automatic circuit board component processes (e.g., pick and place devices) without cracking and failure. The capacitive component of this invention will also be resistant to thermal shock and environmental degradation. Still another important feature of this invention is the savings in circuit board real estate by the positioning of the decoupling capacitor underneath the integrated circuit package.

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figures 1, 2:
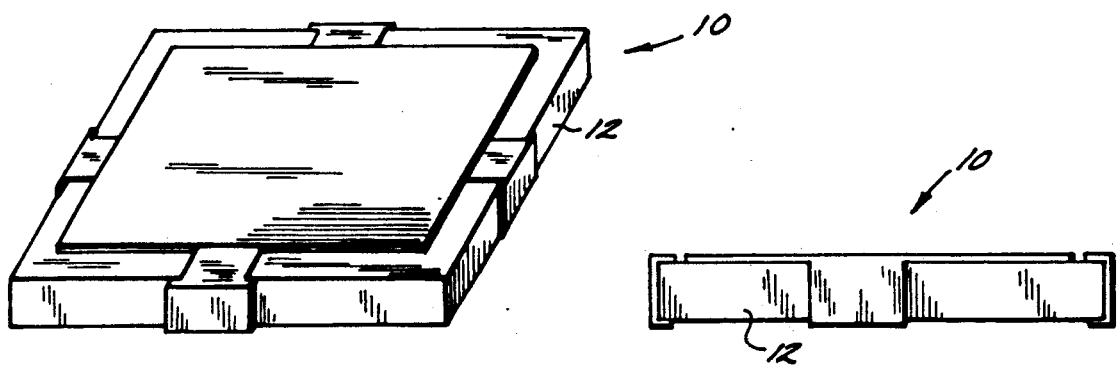
FIG. 1 is a perspective view of a decoupling capacitor in accordance with the present invention.
FIG. 2 is a side elevation view of the decoupling capacitor of FIG. 1.
Figure 3:
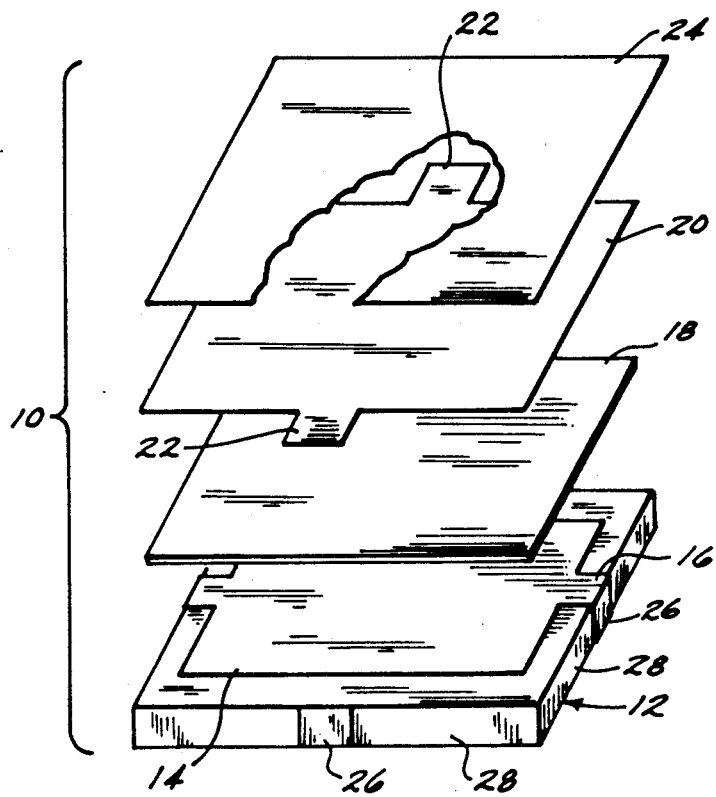
FIG. 3 is an exploded perspective view of the decoupling capacitor of FIG. 1.

In accordance with the present invention, a decoupling capacitor for mounting underneath an integrated circuit board comprises a relatively high capacitance layer (which has been made by known thick or thin film methods) sandwiched between a pair of thin electrodes with this resultant capacitive element being deposited onto a mechanically rugged ceramic or other suitable substrate. An example of a decoupling capacitor suitable for use in the present invention is shown generally at 10 in FIGS. 1 and 2.

Figure 4A:
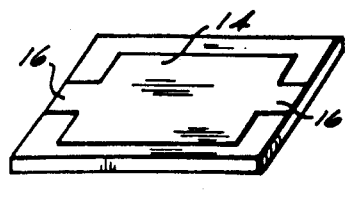
FIGS. 4A-4E are top plan views of a method of manufacturing the capacitor of FIG. 1.
Figure 4B:
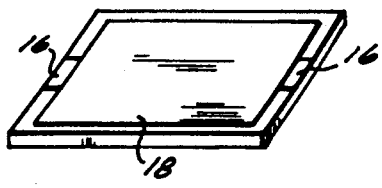
Figure 4C:
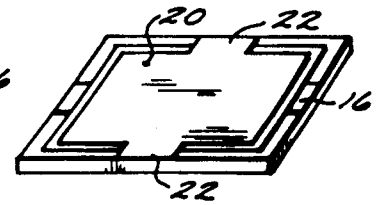
Figure 4D:
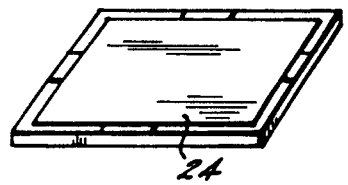
Figure 4E:
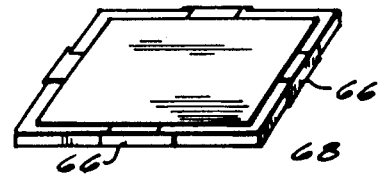

Referring to FIG. 3 and 4A-E, a method for making capacitor 10 is shown. Turning first to FIGS. 3A and 4A, capacitor 10 includes a relatively thick base or substrate 12 (e.g., 0.008-0.010 inch thick) which is preferably made of a ceramic material and includes a first (lower) electrode 14 printed thereon. A plurality of spaced conductive leads 16 (in the form of circuit traces) extend from electrode 14 to the outer edges of substrate 12. Next, a thin layer of dielectric material 18 having a high dielectric constant is provided onto electrode 14 (FIG. 4B). The second (upper) electrode 20 is then printed or otherwise deposited onto the upper surface of dielectric layer 18 along with a plurality of selectively positioned printed leads 22 (also in the form of circuit traces) which again extend toward the outer edges of substrate 12 (FIG. 4C). A protective (electrically insulating) layer 24 is then applied over the second electrode 20 as shown in FIG. 4D. Finally, castellations or terminations 26 are deposited on the side surfaces 28 of substrate 12 in alignment with leads 16 and 22 (FIG. 4E).

The ceramic substrate 12 can be made of alumina (96%), aluminum nitride, zirconia, beryllia or other suitable material. Among the above mentioned, aluminum nitride and beryllia have the advantage of higher thermal conductivity than alumina (a high thermal conductivity is important for enhanced heat removal from the IC package).

In general, the capacitive element (made up of electrodes 14, 20 and dielectric layer 18) may be built up on ceramic substrate 12 using either thick film or thin film techniques. The thick film technique may utilize processes already well known in the art including screening, drying, firing and bore coating of castellations. The thin film technology may employ any one of several different methods for coating of the dielectric and electrode layers. Among these techniques may be chemical vapor deposition (CVD), low temperature arc vapor deposition (LTAVD), spin-coating by a sol or sol-gel technology, sputtering or ion-plating. It will be readily apparent to those of ordinary skill in the art that some of those techniques may only be compatible for depositing either the dielectric or the electrode, while some may be utilized to produce both the dielectric and the electrode. A discussion will now be made in more detail of the preferred thick and thin film techniques employed for forming the capacitive element (items 14, 18 and 20).

The electrode layers 14, 20 may be either screen printed, vapor deposited or sputtered and can be made of silver palladium, gold, tungsten, molybdenum or other suitable base metal that will not oxidize at the sintering temperatures of the ceramic dielectric layer 18 and protective layer 24. The electrodes are preferably silver/palladium thick film conductor compositions or other conductive metallizations made in the form of thick film inks; or any conductor deposited by a vacuum technology.

The dielectric layer 18 preferably comprises a printed layer of a glass ceramic high dielectric paste (having a DK of approximately 1750-3000), with a fixed thickness in the vicinity of 0.001″. Examples of such pastes include barium titanate, lead magnesium niobate (with or without glass additions) or strontium titanate. Alternatively, dielectric layer 18 can be fabricated by a dielectric sol-gel, spin deposited on the electrode layer 14 and sintered at relatively low temperature (600-800° C.) The dielectric sol-gel is preferably based on a barium titanate which is properly doped to achieve the desired temperature stability characteristic. One of the advantages of the latter sol-gel embodiment is that very thin dielectric films can be obtained (approximately 1 micron), so that a very high capacitance volumetric efficiency can be realized. Also, with a very thin dielectric layer, the inductance of the capacitor body itself is greatly reduced, thereby reducing the inductance of the decoupling loop and enhancing the effectiveness of the decoupling capacitor 10 to suppress high frequency noise.

If a sol-gel method is used to fabricate the dielectric layer 18, the surface of the first electrode layer should be polished to achieve a finish with features of less than 0.1 micron in size, to minimize the possibility of puncturing the dielectric layer.

The protective insulating layer 24 should encapsulate the entire component and can be fabricated by printing and firing a ceramic paste (not necessarily having high dielectric constant), a glass of the proper glazing temperature or a suitable polymer. Examples include silicone, epoxy resin, glass filled epoxy resin or a hermetically sealed glass composition.

The castellations 66 are preferably coated onto substrate 12 by screen printing (commonly known as "bore coating"). The castellations are preferably comprised of a material that will be identical in metal composition to electrodes 14 and 18; but may possess improved rheological properties for ease of coating.

Preferably, the thickness of the capacitive element (e.g., electrode layers 14, 20 and dielectric layer 18) is between 0.0012″ to 0.0014″ microns when a thin film dielectric layer 18 is used. The total thickness of the decoupling capacitor is preferably as follows (when a thick film dielectric 18 is used):

| | | |
|---|---|---|
| Substrate 12 | .254 mm | (.008″-.010″) |

| -continued | | |
|---|---|---|
| 1st Electrode Layer 14 | .015 mm | (.0006") |
| Dielectric Layer 18 | .030 mm | (.0012") |
| 2nd Electrode Layer 20 | .015 mm | (.0006") |
| Encapsulant 24 | .076 mm | (.003") |
| TOTAL THICKNESS | .390 mm | (.0134"–.0154") |

If more capacitance is desired, an additional or second layer of dielectric may be deposited on the second electrode 20 with a third electrode then being provided over the second dielectric layer. The protective layer 24 would then be provided over the third electrode. Additional dielectric layers can be built up in this fashion. Any additional dielectric and electrode layers would be added at the same thickness as listed above.

Figure 5:
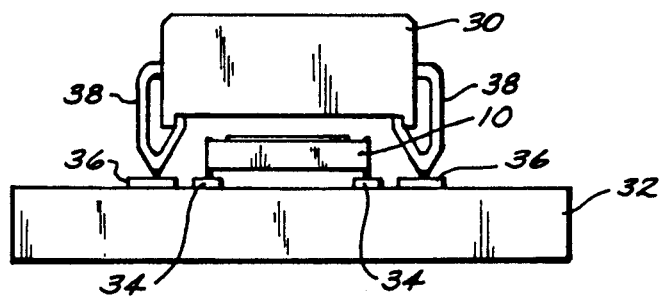
FIG. 5 is a side elevation view depicting the decoupling capacitor of FIG. 1 positioned between a SOJ integrated circuit package and a circuit board.

Turning now to FIG. 5, a decoupling capacitor 10 is shown Positioned underneath a small outline J-leaded (SOJ) integrated circuit package 30. Capacitor 10 is surface mounted on a circuit board 32 which includes surface mounting conductive pads 34 and 36 thereon. Leads 38 from IC package 30 are soldered or otherwise electrically connected to pads 36 while castellations 26 are soldered or otherwise attached to pads 34.

Figure 6:
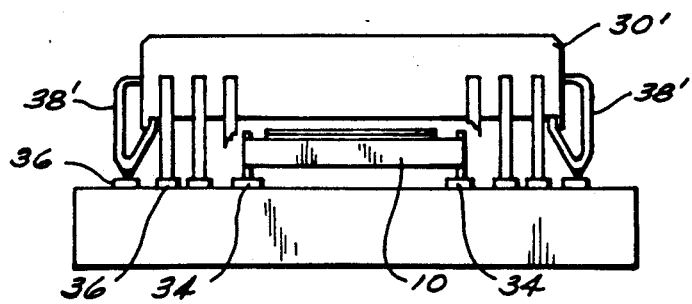
FIG. 6 is a side elevation view of the decoupling capacitor of FIG. 1 positioned between a PLCC integrated circuit package and a circuit board.

Similarly, in FIG. 6, a decoupling capacitor 10 in accordance with the present invention is positioned between a plastic leaded chip carrier (PLCC) IC package 30' and a circuit board 22 in the same manner as in FIG. 5. Of course, it will be appreciated that decoupling capacitor 10 may utilize many other types of IC packages including DIP IC packages and pin grid array (PGA) packages. In addition, leads may be substituted for castellations 26 in those applications requiring through-hole connections.

The present invention has many features and advantages relative to prior art IC decoupling schemes. If a decoupling component positioned under an IC for surface mount boards utilizes a traditional multilayer capacitor (MLC), the MLC would have to be thinner than any now made (e.g., less than 0.020"). It is well known that the thinner an MLC is, the weaker the chip becomes. Moreover, even with the relatively thick MLC's the opportunity for microcracking and failure is always present. The present invention overcomes this problem by providing a very thin (less than or equal to 0.020 inch) decoupling capacitor which may be easily positioned underneath existing IC packages.

In order for such a decoupling capacitor of the type described herein to be practical in the world of surface mounting, it would have to be automatically pick-and-placed. Again, it is well known that even relatively thick MLC's (greater than 0.020") are not rugged enough to always withstand the stresses associated with pick and place and maintain their reliability. Therefore, the rugged, alumina mounted, polymer encapsulated capacitor of this invention fills an important industry need.

Finally, because the capacitor of this invention is mounted underneath the IC package, it takes up no board real-estate. It also reduces the length of the leads between power and ground of the IC and the capacitor, thus minimizing inductance.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoupling capacitor comprising:
  a capacitive element formed on a ceramic support substrate, said capacitive element including leads in the form of circuit traces which extend outwardly therefrom and along a surface of said ceramic substrate, said capacitive element comprising at least one thin layer of deposited dielectric sandwiched between at least a pair of thin layers of deposited electrodes, said ceramic substrate including side surfaces and wherein each of said circuit traces terminates on one of said side surfaces; and
  a protective layer intimately covering said capacitive element wherein said covered capacitive element and ceramic substrate have a total thickness of less than or equal to about 0.020 inch.

2. The capacitor of claim 1 wherein:
  said capacitive element has a thickness of less than or equal to about 0.012 inch.

3. The capacitor of claim 1 wherein:
  said electrodes are screen printed, vapor deposited or sputtered.

4. The capacitor of claim 1 wherein:
  said dielectric layer comprises a thin deposited layer of ceramic paste or dielectric sol-gel.

5. The capacitor of claim 4 wherein:
  said dielectric layer has a dielectric constant of between about 1750–3000.

6. The capacitor of claim 4 wherein:
  said dielectric layer has a thickness of less than or equal to 0.0012 inch.

7. The capacitor of claim 1 wherein:
  said ceramic substrate has a thickness of less than or equal to 0.010 inch.

8. The capacitor of claim 1 wherein each of said circuit traces terminates at a castellation.

9. An electronic subassembly comprising:
  an integrated circuit chip carrier package, said chip carrier package having an array of conductive connecting means arranged exteriorly on the perimeter thereof, at least some of the connecting means being first and second voltage level connecting means;
  a circuit board, said circuit board having conductive traces thereon receiving said connecting means from said chip carrier package; and
  decoupling capacitor means, said decoupling capacitor means being mounted under and aligned with said chip carrier package and electrically communicating with said circuit board, said capacitor means comprising;
  a capacitive element formed on a ceramic support substrate, said capacitive element including leads in the form of circuit traces which extend outwardly therefrom and along a surface of said ceramic substrate, said capacitive element comprising at least one thin layer of deposited dielectric sandwiched between at least a pair of thin layers of deposited electrodes, said ceramic substrate including side surfaces and wherein each of said circuit traces terminates on one of said side surfaces wherein said covered capacitive element and ceramic substrate have a total thickness of less than or equal to about 0.020 inch; and a protective layer intimately covering said capacitive element.

10. The sub-assembly of claim 9 wherein:
  said capacitive element has a thickness of less than or equal to about 0.010 inch.

11. The sub-assembly of claim 9 wherein:
said electrodes are screen printed, vapor deposited or sputtered.

12. The sub-assembly of claim 9 wherein:
said dielectric layer comprises a thin deposited layer of ceramic paste or dielectric sol-gel.

13. The sub-assembly of claim 12 wherein:
said dielectric layer has a dielectric constant of between about 1750-3000.

14. The sub-assembly of claim 13 wherein:
said dielectric layer has a thickness of less than or equal to 0.0012 inch.

15. The sub-assembly of claim 9 wherein:
said ceramic substrate has a thickness of less than or equal to 0.010 inch.

16. The sub-assembly of claim 9 wherein each of said circuit traces terminates at a castellation.

17. A decoupling capacitor for use with integrated circuit chip carrier package wherein the chip carrier package has an array of conductive connecting means arranged exteriorly on the perimeter thereof, at least some of the conductive connecting means being first and second voltage level conductive connecting means, the capacitor including:
a capacitive element formed on a ceramic support substrate, said capacitive element including leads in the form of circuit traces which extend outwardly therefrom and along a surface of said ceramic substrate, said capacitive element comprising at least one thin layer of deposited dielectric sandwiched between at least a pair of thin layers of deposited electrodes, said ceramic substrate including side surfaces and wherein each of said circuit traces terminates on one of said side surfaces wherein said covered capacitive element and ceramic substrate have a total thickness of less than or equal to about 0.020 inch; and
a protective layer intimately covering said capacitive element.

18. The capacitor of claim 17 wherein:
said capacitive element has a thickness of less than or equal to about 0.012 inch.

19. The capacitor of claim 17 wherein:
said electrodes are screen printed, vapor deposited or sputtered.

20. The capacitor of claim 17 wherein:
said dielectric layer comprises a thin deposited layer of ceramic paste or dielectric sol-gel.

21. The capacitor of claim 17 wherein:
said dielectric layer has a dielectric constant of between about 1750-3000.

22. The capacitor of claim 17 wherein:
said dielectric layer has a thickness of less than or equal to 0.0012 inch.

23. The capacitor of claim 17 wherein:
said ceramic substrate has a thickness of less than or equal to 0.010 inch.

24. The capacitor of claim 17 wherein each of said circuit traces terminates at a castellation.

* * * * *